United States Patent [19]

Neely

[11] Patent Number: 4,486,674
[45] Date of Patent: Dec. 4, 1984

[54] THREE STATE GATE HAVING ENHANCED TRANSITION TO AN ACTIVE LOW

[75] Inventor: Eric D. Neely, Phoenix, Ariz.

[73] Assignee: Motorola, Inc., Schaumburg, Ill.

[21] Appl. No.: 510,852

[22] Filed: Jul. 5, 1983

[51] Int. Cl.$^3$ .................. H03K 19/088; H03K 19/013
[52] U.S. Cl. .................................... 307/473; 307/254; 307/456
[58] Field of Search .............................. 307/456–458, 307/473, 443, 254, 270

[56] References Cited

U.S. PATENT DOCUMENTS

| | | | |
|---|---|---|---|
| 3,510,685 | 5/1970 | Watanabe et al. | 307/456 |
| 4,081,695 | 3/1978 | Allen et al. | 307/473 |
| 4,255,670 | 3/1981 | Griffith | 307/473 |
| 4,321,490 | 3/1982 | Bechdolt | 307/456 |
| 4,356,409 | 10/1982 | Masuda et al. | 307/456 X |
| 4,424,455 | 1/1984 | Neely | 307/458 X |
| 4,430,585 | 2/1984 | Kirk, Jr. | 307/473 |

FOREIGN PATENT DOCUMENTS

| | | | |
|---|---|---|---|
| 25831 | 3/1981 | Japan | 307/473 |
| 157130 | 12/1981 | Japan | 307/458 |

*Primary Examiner*—Larry N. Anagnos
*Attorney, Agent, or Firm*—William E. Koch

[57] ABSTRACT

A three state gate having an output capable of assuming an active high, an active low, or a high impedance state is disclosed that has an enhanced transition from the active high to the active low. An output means includes a first transistor for supplying current to the output and a second transistor for sinking current from the output. A phase splitter means coupled to the output means determines the conductivity of the first and second transistors. An input means is responsive to an input signal and controls the phase splitter means. An output enable means is provided that disables both the first and second transistors for providing the high impedance output. A feedback means for enhancing the downward transition of the output signal from an active high to an active low includes a feedback transistor having a base connected to a supply voltage terminal by a resistor which can be used to vary the speed of the downward transition. A diode is coupled between the collector of the feedback transistor and the output terminal. The feedback transistor is reverse biased, except when the output signal is transitioning from the active high to the active low. A second diode is coupled between the base of the first output transistor and the collector of the feedback transistor for discharging stored base-collector capacitance of the first output transistor.

2 Claims, 3 Drawing Figures

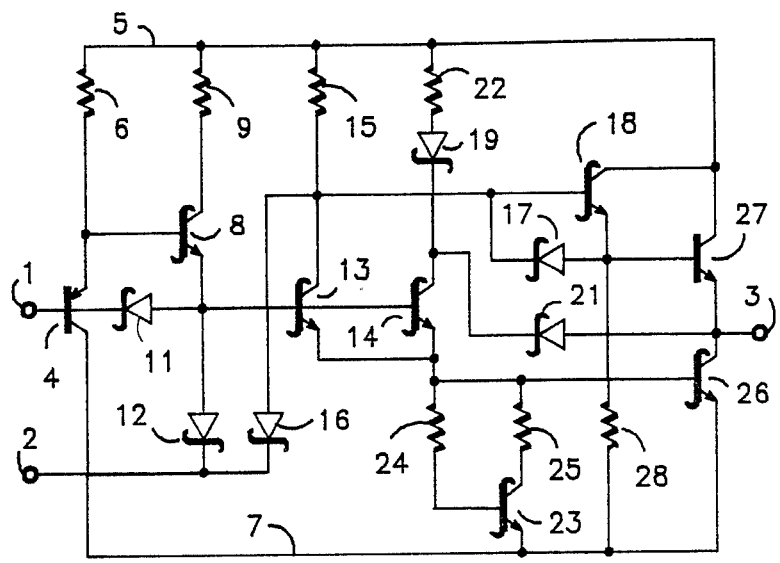
FIG. 1 — PRIOR ART —
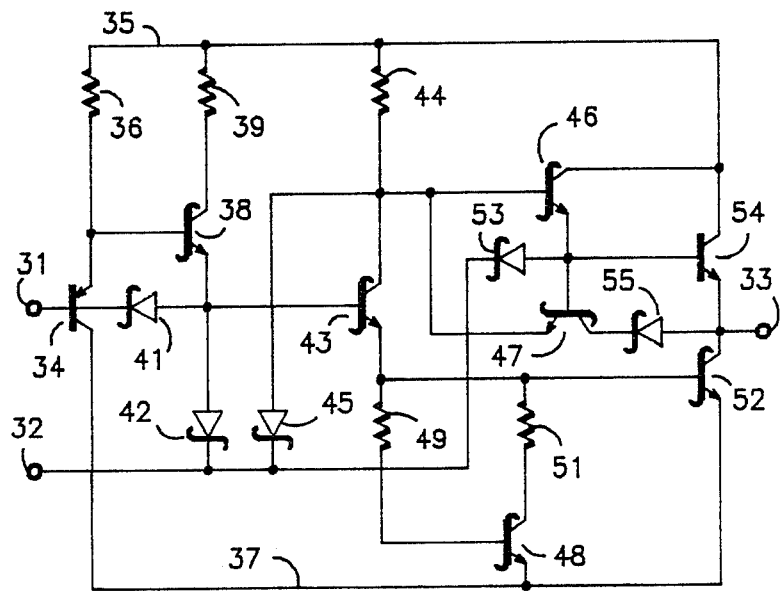
FIG. 2 — PRIOR ART —

THREE STATE GATE HAVING ENHANCED TRANSITION TO AN ACTIVE LOW

BACKGROUND OF THE INVENTION

1. Field of the Invention

This invention relates, in general, to three state gates and, more particularly, to an inverting three state gate wherein the transition from an active high to an active low output is enhanced.

2. Background Art

Three state gates have an output which is capable of assuming an active high, an active low, or a high impedance state. Generally, most previously known gates having bipolar transistors comprise a push-pull output driver stage, a phase-splitting stage, and an input stage. The push-pull output driver stage comprises a dual transistor arrangement wherein an upper transistor is coupled between a DC voltage supply and an output load and a lower transistor is coupled between the output load and ground. In operation, a high output voltage is realized at the output terminal by turning on the upper transistor and turning off the lower transistor; a low output voltage is realized by turning off the upper transistor and turning on the lower transistor; and a high impedance is achieved by turning off both transistors.

The phase splitting stage comprises a transistor coupled between the bases of the two output transistors of the output stage that would selectively turn on one of the two output stage transistors. The input stage comprises a PNP transistor having a base connected to an input terminal. A first NPN transistor has its base connected to the emitter of the PNP transistor. A second NPN transistor has a base connected to the emitter of the first NPN transistor. The bases of the first NPN transistor, the second NPN transistor, the phase splitting transistor, and the output stage upper transistor are each coupled to an output enable terminal by diodes. A low output enable signal directs current away from the transistor bases through these diodes, thus turning off both of the upper and lower transistors of the output stage, giving a high impedance at the output terminal. A high signal on the output enable terminal reverse biases the diodes, effectively removing their paths from the circuit.

It is desired to have the output transition rapidly from an active high to an active low when the appropriate input signal is received. One previously known method of increasing the downward transition of the output signal is shown in FIG. 1 and will be described in detail in the Detailed Description of the Invention. Generally, a feedback diode is coupled between the output terminal and the collector of a feedback transistor for momentarily conducting current away from the output terminal until an active low is reached wherein the first diode will be reverse biased. A second feedback diode is coupled between the base of the upper output transistor and the phase splitting means for momentarily conducting current in a similar fashion to drain the capacitive charge on the base-collector of the upper output transistor.

A second previously known method of enhancing the transition from an active high to an active low of the output is shown in FIG. 2 and is also described in detail in the Detailed Description of the Invention. Generally, a feedback transistor is coupled between the output transistor and the phase splitting means and has its base connected to the base of the upper output transistor. A first diode is coupled between the feedback transistor and the output terminal. A second diode is coupled between the base of the upper output transistor and the output enable terminal. This arrangement again enhances the transition of the output from an active high to an active low by momentarily pulling current away from the output terminal and also discharging the capacitive charge stored on the base-collector of the upper output transistor.

However, the circuit as shown in FIG. 1 requires matching of a transistor in the phase splitting means and the feedback transistor to avoid current hogging of their respective base drive. Furthermore, none of the previously known three state gates provide a method of directly controlling the speed of the enhanced transition to an active low state. Furthermore, the previously known circuits do not compensate for reflected waves (i.e., transmission lines) when in the active low state.

Thus, a need exists for an improved three state gate having an enhanced transition to an active low wherein the speed of transition may be directly controlled, the matching of devices is eliminated, and which compensates for reflected waves at the output terminal in the active low state.

SUMMARY OF THE INVENTION

Accordingly, it is an object of the present invention to provide an improved three state gate having enhanced transition to the active low state.

Another object of the present invention is to provide a three state gate wherein the transition speed to the active low state is directly controlled.

A further object of the present invention is to provide a three state gate that compensates for reflected waves at the output terminal.

In carrying out the above and other objects of the invention in one form, there is provided an improved three state gate having an input stage, a phase splitting stage, and an output stage, wherein the output stage provides an active high, an active low, or a high impedance state as an output. A feedback means includes a transistor having a control electrode coupled to a supply voltage terminal, a first current carrying electrode coupled to the output terminal and a second current carrying electrode coupled to the phase splitting means. A diode is coupled between the first current carrying electrode and the output terminal. A resistor is coupled between the control electrode and the supply voltage terminal, wherein the speed of the transition from the active high to the active low varies with the value of the resistor.

The above and other objects, features, and advantages of the present invention will be better understood from the following detailed description taken in conjunction with the accompanying drawings.

BRIEF DESCRIPTION OF THE DRAWINGS

FIG. 1 illustrates in schematic form a prior art three state gate;

FIG. 2 illustrates in schematic form another prior art three state gate; and

DETAILED DESCRIPTION OF THE INVENTION

Figure 3:
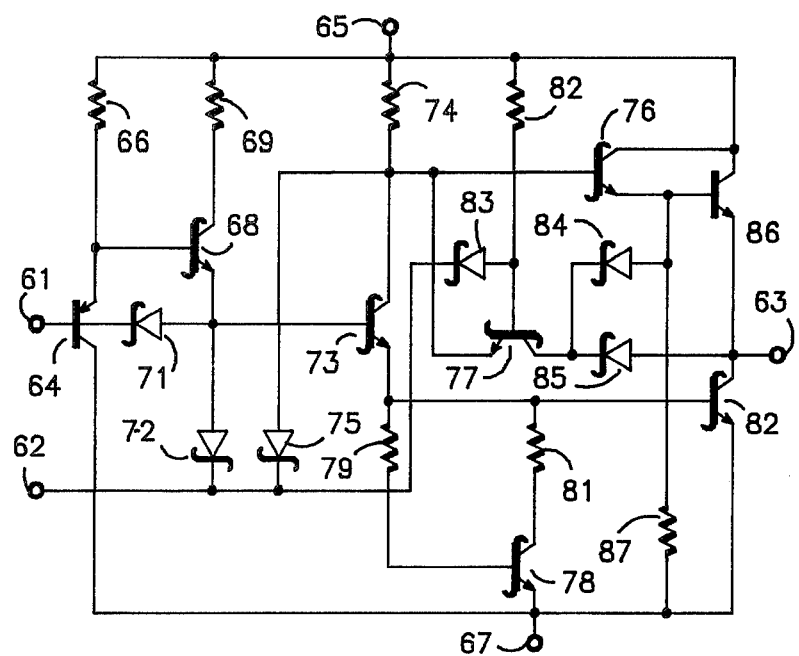
FIG. 3 illustrates in schematic form the preferred embodiment of the present invention.

Referring to FIG. 1, a previously known three state gate is shown that is similar to the circuit illustrated in U.S. Pat. No. 4,255,670 and includes input terminal 1, output enable terminal 2, and output terminal 3. PNP transistor 4 has its base connected to input terminal 1 and is responsive to an input signal which may assume a first or second voltage level, its emitter coupled to supply voltage terminal 5 by resistor 6, and its collector connected to supply voltage terminal 7. Schottky NPN transistor 8 has its base connected to the emitter of transistor 4, its collector coupled to supply voltage terminal 5 by resistor 9, and its emitter connected to the anodes of Schottky diodes 11, 12 and to the bases of Schottky NPN transistors 13, 14. Transistors 4, 8, and diode 11 translate the voltage level of the input signal at input terminal 1 to the bases of transistors 13, 14 while providing isolation from input terminal 1.

Transistor 13 has its collector coupled to supply voltage terminal 5 by resistor 15 and connected to the anode of Schottky diode 16, the cathode of Schottky diode 17, and the base of Schottky transistor 18. The cathodes of diodes 12, 16 are connected to output enable terminal 2 for sinking current from the bases of transistors 13, 14, 18, 27 when the output enable signal on output enable terminal 2 has a low voltage level. The collector of transistor 14 is connected to the cathode of Schottky diodes 19, 21. The anode of diode 19 is coupled to supply voltage terminal 5 by resistor 22 and the anode of diode 21 is connected to output terminal 3. The emitters of transistors 13, 14 are both coupled to the base of Schottky NPN transistor 23 by resistor 24, coupled to the collector of transistor 23 by resistor 25, and connected to the base of Schottky NPN transistor 26. The emitters of transistors 23, 26 are connected to supply voltage terminal 7. Transistor 23 and resistors 24, 25 provide an active pull-down for the base of transistor 26.

Transistor 18 has its collector connected to supply voltage terminal 5 and its emitter connected to the anode of diode 17, the base of NPN transistor 27, and coupled to supply voltage terminal 7 by resistor 28. Transistor 27 has its collector connected to supply voltage terminal 5 and its emitter connected to output terminal 3 and the collector of transistor 26. When transistor 27 receives base drive, its emitter will supply current to output terminal 3. When transistor 26 receives base drive, its collector will sink current from output terminal 3. When neither transistor 27 or 26 receives base drive, output terminal 3 will reflect a high impedance.

A low voltage level applied to output enable terminal 2 will divert current through diodes 12, 16 from the bases of transistors 13, 14, 18, respectively, insuring their non-conductivity. Since transistors 13, 14, 18 are off, the bases of transistors 26, 27 will not receive any current. With both of transistors 26, 27 off, output terminal 3 will reflect a high impedance. However, when a high voltage level is applied to output enable terminal 2, diodes 12, 16 are reverse biased, effectively taking their paths out of the circuit.

A low voltage level on input terminal 1 will turn on transistor 4, thereby translating a low signal to the bases of transistors 8, 13, 14. With transistor 13 off, the base of transistor 18 goes high, turning on transistor 27 and translating a high to output terminal 3. With transistors 13, 14 off, no base current is provided to transistor 26, thereby preventing it from sinking any current from output terminal 3.

A high voltage level on input terminal 1 will turn off transistor 4, thereby translating a high signal to the bases of transistors 8, 13, 14. With transistor 13 conducting, a low signal is translated to the bases of transistors 18, 27 and a high signal is translated to the base of transistor 26, thereby insuring an active low on output terminal 3.

In order to enhance the transition from the active high to the active low on output terminal 3, diode 21 is coupled between output terminal 3 and the collector of transistor 14. When a high voltage level is applied to the base of transistor 4 and a high signal is translated to the base of transistor 14, diode 21 momentarily conducts drawing current away from output terminal 3 through transistor 14. As soon as output terminal 3 reaches the active low, diode 21 is reverse biased and the current flow therethrough is halted. Diode 17 is coupled between the base of transistor 27 and the collector of transistor 13 and momentarily conducts current in a similar fashion to discharge the capacitive charge on the base-collector of transistor 27. Note that transistors 13, 14 must be matched to avoid current "hogging" of their respective bases.

Referring to FIG. 2, a second previously known three state gate is shown that is similar to the circuit in U.S. Pat. No. 4,081,695 and includes input terminal 31, output enable terminal 32 and output terminal 33. PNP transistor 34 has its base connected to input terminal 31 and is responsive to an input signal which may assume a first or a second voltage level, its emitter coupled to supply voltage terminal 35 by resistor 36, and its collector connected to supply voltage terminal 37. Schottky PNP transistor 38 has its base connected to the emitter of transistor 34, its collector coupled to supply voltage terminal 35 by resistor 39, and its emitter connected to the anodes of Schottky diodes 41, 42 and to the base of Schottky NPN transistor 43. Transistors 34, 38 and diode 41 translate the voltage level of the input signal at input terminal 31 to the base of transistor 43 while providing isolation from input terminal 31.

Transistor 43 has its collector coupled to supply voltage terminal 35 by resistor 44 and connected to the anode of Schottky diode 45, the base of Schottky NPN transistor 46, and the emitter of Schottky NPN transistor 47. The cathode of diodes 42, 45 are connected to output enable terminal 32 for sinking current from the bases of transistors 43, 46 when the output enable signal on output enable terminal 32 has a low voltage level.

The emitter of transistor 43 is coupled to the base of Schottky NPN transistor 48 by resistor 49, the collector of transistor 48 by resistor 51, and is connected to the base of Schottkly NPN transistor 52. Transistor 48 and resistors 49, 51 provide an active pull-down for the base of transistor 52.

The emitter of transistor 46 is connected to the anode of diode 53 and to the bases of transistors 47, 54. The collectors of transistors 46, 54 are connected to supply voltage terminal 35, and the emitter of transistor 52 is connected to supply voltage terminal 37. Schottky diode 55 has its cathode connected to the collector of transistor 47 and its anode connected to output terminal 33. The emitter of transistor 54 is connected to output terminal 33 for supplying current thereto and the collector of transistor 52 is connected to the output terminal for sinking current therefrom. The cathode of diode 53 is connected to output enable terminal 32 for sinking current from the base of transistor 54 when the output enable signal is low.

The operation of the three state gate illustrated in FIG. 2 is similar to that of the three state gate illustrated in FIG. 1. However, the three state gate of FIG. 2 has an improved method of enhancing the transition of the output signal from an active high to an active low. As previously, described, transistor 47 and diode 55 are coupled in series between output terminal 33 and the collector of transistor 43. The base of transistor 47 is connected to the emitter of transistor 46. An input signal having a low voltage level translates a high voltage level to the bases of transistors 46, 47 and output terminal 33. However, transistor 47 is reverse biased and no current flows therethrough. When an input signal having a high voltage level is applied to input terminal 31, a low voltage level appears on the collector of transistor 43. Transistor 47 is no longer reverse biased and the downward transition of the output signal on output terminal 33 is enhanced by current flowing through diode 55, transistors 47, 43. When an active low is reached on output terminal 33 due to transistors 46, 54 becoming nonconductive, transistor 47 will again be reverse biased. Additionally, diode 53 is coupled between the base of transistor 54 and output enable terminal 32 to assure that transistor 47 remains off during the output high impedance state.

Referring now to FIG. 3, the preferred embodiment of the present invention includes input terminal 61, output enable terminal 62, and output terminal 63. PNP transistor 64 has its base connected to input terminal 61 and is responsive to an input signal which may assume a first or a second voltage level, its emitter coupled to supply voltage terminal 65 by resistor 66, and its collector connected to supply voltage terminal 67. Schottky NPN transistor 68 has its base connected to the collector of transistor 64, its collector coupled to supply voltage terminal 65 by resistor 69, and its emitter connected to the anodes of Schottky diodes 71, 72 and to the base of Schottky NPN transistor 73. Transistors 64, 68 and diode 71 translate the voltage level of the input signal at input terminal 61 to the base of transistor 73 while providing isolation from input terminal 61.

Transistor 73 has its collector coupled to supply voltage terminal 65 by resistor 74 and connected to the anode of Schottky diode 75, the base of Schottky NPN transistor 76, and the emitter of Schottky NPN transistor 77. The emitter of transistor 73 is coupled to the base of Schottky NPN transistor 78 by resistor 79, the collector of transistor 78 by resistor 81 and is connected to the base of transistor 82. The emitter of transistor 78 is connected to supply voltage terminal 67. Transistor 78 and resistors 79, 81 provide an active pull-down for the base of transistor 82.

Transistor 77 has its base coupled to supply voltage terminal 65 by resistor 82 and is connected to the anode of diode 83. The cathode of diodes 83, 72, 75 are connected to output enable terminal 62 for sinking current from the bases of transistors 77, 73, 76 when the output enable signal has a low voltage level. The collector of transistor 77 is connected to the cathode of Schottky diodes 84, 85. The anode of diode 84 is connected to the emitter of transistor 76, the base of transistor 86, and is coupled to supply voltage terminal 67 by resistor 87. The collectors of transistors 76, 86 are connected to supply voltage terminal 65 and the emitter of transistor 82 is connected to supply voltage terminal 67. The emitter of transistor 86 and the collector of transistor 82 are connected to output terminal 63 for supplying current thereto and sinking current therefrom, respectively. Additionally, output terminal 63 is connected to the anode of diode 85.

In operation, a low voltage level applied to output enable terminal 62 will divert current through diodes 72, 75, 83 from the bases of transistors 73, 76, 77, respectively, insuring their nonconductivity. Since transistors 73, 76 are off, the bases of transistors 82, 86 will not receive any current. With both of transistors 82, 86 off, output terminal 63 will reflect a high impedance. However, when a high voltage level is applied to output enable terminal 62, diodes 72, 75, 83 are reverse biased, effectively taking their paths out of the circuit.

A low voltage level on input terminal 61 will turn on transistor 64, thereby diverting base current away from transistor 68 and turning off transistor 73. A high signal is therefore provided to the bases of transistors 76, 86 and output terminal 63. With transistor 73 off, no base drive is provided to transistor 82.

A high voltage level on input terminal 61 will turn off transistor 64, thereby translating a high signal to the bases of transistors 68, 73. With transistor 73 conducting, transistors 76, 86 will not receive any base drive insuring their nonconductivity. With transistor 73 conducting, base current is supplied to transistor 82, thereby sinking current from output terminal 63 to supply voltage terminal 67 and causing output terminal 63 to have an active low state.

The speed of the transition of the output signal from the active high to the active low is enhanced by having transistor 77 and diode 85 coupled between output terminal 63 and the collector of transistor 73. When the input signal assumes a high voltage level and transistor 73 is turned on, current is taken from output terminals 63 through diode 85, transistors 77, 73 to increase the downward transition of the output signal. When the output signal reaches an active low, transistor 77 remains active, thereby providing an additional path for sinking current from output terminal 63. Additionally, diode 84 is coupled between the base of transistor 86 and the collector of transistor 77 for discharging the stored base-collector capacitance of transistor 86, further enhancing the downward transition of the output signal. By changing the value of resistor 82, the current supplied to the base of transistor 77 and the enhanced speed of the downward transition is controlled.

By now it should be appreciated that there has been provided a three state gate having an enhanced downward transition of the output signal from an active high to an active low, that requires no matching of transistors.

I claim:

1. A three state gate having an input stage, a phase splitting stage including a first transistor having a collector coupled to a first supply voltage terminal and a base coupled to an input terminal, and an output stage including a second and third transistor, said second transistor having a collector coupled to said first supply voltage terminal, an emitter coupled to an output terminal, and a base coupled to said collector of said first transistor, said third transistor having a collector coupled to said output terminal, an emitter coupled to a second supply voltage terminal, and a base coupled to an emitter of said first transistor, said output stage providing an active high, an active low, or a high impedance state as an output at said output terminal, and an improved feedback means comprising a fourth transistor having a base coupled to said first supply voltage terminal by a resistor, a collector coupled to said output terminal by a first diode and coupled to a base of said second transistor by a second diode, and an emitter coupled to said collector of said first transistor.

2. A three state gate having an input terminal, an output enable terminal, a first and a second supply voltage terminal, and an output terminal for providing an output having an active high, an active low, and a high impedance state, said three state gate comprising:

input means coupled to said input terminal for receiving an input signal;

phase splitting means for generating an in-phase signal and an out of phase signal comprising a first transistor having a collector coupled to said first supply voltage terminal and a base coupled to said input terminal;

output means for providing said output signal comprising a second and third transistor, said second transistor having a collector coupled to said first supply voltage terminal, an emitter coupled to said output terminal, and a base coupled to said collector of said first transistor for receiving said out of phase signal, said third transistor having a collector coupled to said output terminal, an emitter coupled to said second supply voltage terminal, and a base coupled to an emitter of said first transistor for receiving said in-phase signal;

enabling means coupled between said output enable terminal and said output means for selectively disabling said output means; and feedback means for selectively enhancing the transition of the output signal from an active high to an active low comprising a fourth transistor having a base coupled to said first supply voltage terminal by a resistor, a collector coupled to said output terminal by a first diode and coupled to a base of said second transistor by a second diode, and an emitter coupled to said collector of said first transistor.

* * * * *